(12) United States Patent
Mahrt et al.

(10) Patent No.: US 8,249,124 B2
(45) Date of Patent: Aug. 21, 2012

(54) OPTICAL WAVELENGTH SWITCH

(75) Inventors: Rainer F. Mahrt, Mellen (CH); Nikolaj Moll, Zurich (CH); Thilo H. C. Stoeferle, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 12/760,368

(22) Filed: Apr. 14, 2010

(65) Prior Publication Data
US 2010/0315697 A1 Dec. 16, 2010

(30) Foreign Application Priority Data

Oct. 29, 2009 (EP) ..................... 09174509

(51) Int. Cl.
*H01S 3/08* (2006.01)
(52) U.S. Cl. ......................................... 372/96
(58) Field of Classification Search ...... 372/96
See application file for complete search history.

(56) References Cited

U.S. PATENT DOCUMENTS

| | | | |
|---|---|---|---|
| 2003/0169787 A1* | 9/2003 | Vurgaftman et al. | 372/20 |
| 2004/0213534 A9* | 10/2004 | Matsuura et al. | 385/129 |

OTHER PUBLICATIONS

Kengo Nozaki et al., "Resonantly photopumped lasing and its switching behavior in a photonic crystal nanolaser," Applied Physics Letters 92, 021501 (2008), 3 pages.
Y. Yu et al., "Fast intra-modal and inter-modal wavelength switching of a high-speed SG-DBR laser for dynamic wavelength routing," Optical and Quantum Electronics 33:641-642, 2001.

* cited by examiner

*Primary Examiner* — Patrick Stafford
(74) *Attorney, Agent, or Firm* — Griffiths & Seaton PLLC

(57) ABSTRACT

Various embodiments of an optical switch device are provided. In one embodiment, the optical switch device includes a substrate. A photonic crystal, having a dielectric material, is applied on the substrate. An optical gain layer, having an optical gain material, is disposed above the photonic crystal. The photonic crystal is formed with a second-order distributed feedback structure to emit laser light perpendicular to a plane of the photonic crystal and a first-order distributed feedback structure adapted for reflecting light in the plane of the photonic crystal back into the second-order distributed feedback structure. The first-order distributed feedback structure at least one of fully surrounds the second-order distributed feedback structure and is arranged on two opposing edges of the second-order distributed feedback structure.

20 Claims, 3 Drawing Sheets

OPTICAL WAVELENGTH SWITCH

CLAIM TO FOREIGN PRIORITY

This application claims priority to European Patent Application No. 09174509.1, filed Jun. 15, 2009 and entitled "Optical Wavelength Switch."

BACKGROUND OF THE INVENTION

1. Field of the Invention

The present invention relates to an enhanced surface-emitting photonic device and, more particularly, to an enhanced surface-emitting photonic device including photonic crystal structures.

2. Description of the Related Art

Laser devices, in general, comprise a material having an optical gain and an optical feedback structure. The optical gain material allows an amplification of a light beam by means of stimulated emission when the optical gain material is brought into a state called population inversion. Stimulated emission is called a process by which an electron, perturbed by an incoming photon may drop to a lower energy level resulting in the creation of a second photon. The perturbing photon is substantially unchanged in the process, and the second photon is created with the same phase, frequency, polarization, and direction of travel as the original. The above process can be thought of as "optical amplification."

As an optical feedback structure, a distributed feedback structure (DFB) may be used which is made of a dielectric material and employs planar structures on a substrate which the optical gain material is applied on. These distributed feedback structures can act as a laser resonator. Distributed feedback structures are usually provided as photonic crystals and the structures have single structures with a periodicity in at least one plane direction, wherein their dielectric constant is periodic. Usually, the distributed feedback structures provide elevations of a feedback material having a first dielectric constant in between which and above which the optical gain material is provided having a second dielectric constant.

The photonic crystals can be dimensioned to support optical waves of specific wavelengths. If the distributed feedback structure is designed as a two-dimensional photonic crystal, the photonic crystal can be provided for supporting different orders of resonance wavelengths. If designed in second order, light can be coupled out perpendicularly to the extension of the two-dimensional photonic crystal. This is a result of a fan-like emission pattern of two orthogonal directions in which optical feedback is provided. The fan-like emission patterns are superimposed so that an emitted light beam is created by interference of the emission patterns.

The aforementioned second-order distributed feedback structure has losses at the edge of the feedback region, which even increases for smaller devices having a smaller periodicity, i.e. the number of a repetition of the single structures in one plane direction. Since the provision of mirrors to reflect the light at the edges into the second-order distributed feedback structure can be badly integrated as planar structures, the use of first-order feedback structures has been proposed which have no perpendicular emission of light and can therefore be used as mirrors on the edges of the second-order feedback structure. The first-order feedback structures are also called distributed Bragg reflectors (DBR). The first-order feedback structure can be arranged on two opposing edges of the second-order feedback structure or can preferably be arranged surrounding the plane of the second-order structures to provide a reflection on all edges of the plane.

A laser device formed by a distributed feedback structure and an optical gain material can be excited by using an optical pump power directed to the optical gain material, wherein the light output can be switched on and off by increasing or decreasing the pump power. Current optical switches rely on changing the modulation of refractive indices. There, the amount of modulation is proportional to the non-linear susceptibility namely the optical Kerr effect. A drawback of these optical switch devices is that known materials usually show very small non-resonant non-linearities. Hence, devices build from these materials require excessive switching power. A further disadvantage is that devices comprising these materials cannot be easily integrated into high density optical interconnects.

For instance, Nozaki et al., "Resonantly photopumped lasing and its switching behavior in a photonic crystal nanolaser", Applied Physics Letters 92, 021501 (2008), describes a wavelength switching in a photonic crystal structure including defects by wavelength variations of the pump source. The switching occurs between a dipole and a monopole mode showing different wavelengths.

Document US 2007/0013 991 A1 describes a photonic crystal semiconductor device for wavelength filtering and lasing by means of a photonic crystal structure with defects.

Yu et al., "Fast intra-modal and inter-modal wavelength switching of a high-speed SG-DBR laser photon dynamic wavelength routing", Optical and Quantum Electronics 33: pages 641 to 652, 2001, Kluwer Academic Publishers, describes inter-modal wavelength switching in a sampled-grating DBR laser.

SUMMARY OF THE INVENTION

To better address the disadvantages previously described, and in accordance with an embodiment of the invention, an optical switch device is provided. According to a first aspect an optical switch device is provided. The optical switch device comprises a substrate. A photonic crystal having a dielectric material is applied on the substrate. An optical gain layer having an optical gain material is disposed above the photonic crystal. The photonic crystal is formed with a second-order distributed feedback structure to emit laser light perpendicular to a plane of the photonic crystal and a first-order distributed feedback structure adapted for reflecting light in the plane of the photonic crystal back into the second-order distributed feedback structure. The first-order distributed feedback structure at least one of fully surrounds the second-order distributed feedback structure and is arranged on two opposing edges of the second-order distributed feedback structure. The second-order distributed feedback structure has single structures with a periodicity indicating the number of repetitions of the single structures and a lattice constant indicating a distance between the single structures and defining an upper bandedge wavelength and a lower bandedge wavelength of light to be emitted. The second-order distributed feedback structure has a periodicity selected such that one or more defect modes of wavelengths between the upper bandedge wavelength and the lower bandedge wavelength are established having a quality factor of more than a predetermined threshold.

One advantage of the optical switch device is that it can be adjusted to any wavelength needed depending on the lattice constant of the photonic crystal. The optical switch allows to not only switch on and off the emitted light beam but also to vary the output wavelength of the emitted light depending on the power of the excitation light. Furthermore, it may be provided that the dielectric material and the optical gain material have different refractive indices.

The second-order distributed feedback structure may have a periodicity which is selected depending on the contrast of refractive indices of the dielectric material of the second-order distributed feedback structure and the optical gain material. According to an embodiment the periodicity of the second-order distributed feedback structure and the periodicity of first-order distributed feedback structure may be adapted such that a ratio of the quality factor of the defect mode of a wavelength generated by the first-order distributed feedback structure and the quality factor of a bandedge mode of a wavelength generated by the second-order distributed feedback structure is more than 0.01, or more than 0.1, or more than 0.5, or more than 0.8. Furthermore, in one embodiment the optical gain material is excited by irradiating light and/or by an electric current.

According to a further aspect the above optical switch device may be provided wherein the power of an excitation light irradiated onto the optical switch device is selected to either emit no light, emit light of a first wavelength or to emit light of a second wavelength. Moreover, there may be no emission when the power of the excitation light is below a lasing threshold, wherein light of a first wavelength may be emitted when the power of the excitation light is above a lasing threshold and below a second threshold, and wherein light of a second wavelength may be emitted when the power of the excitation light is above the second threshold.

Additional features and advantages are realized in the techniques of the present invention. Other embodiments and aspects of the invention are described in detail herein and are considered a part of the claimed invention.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
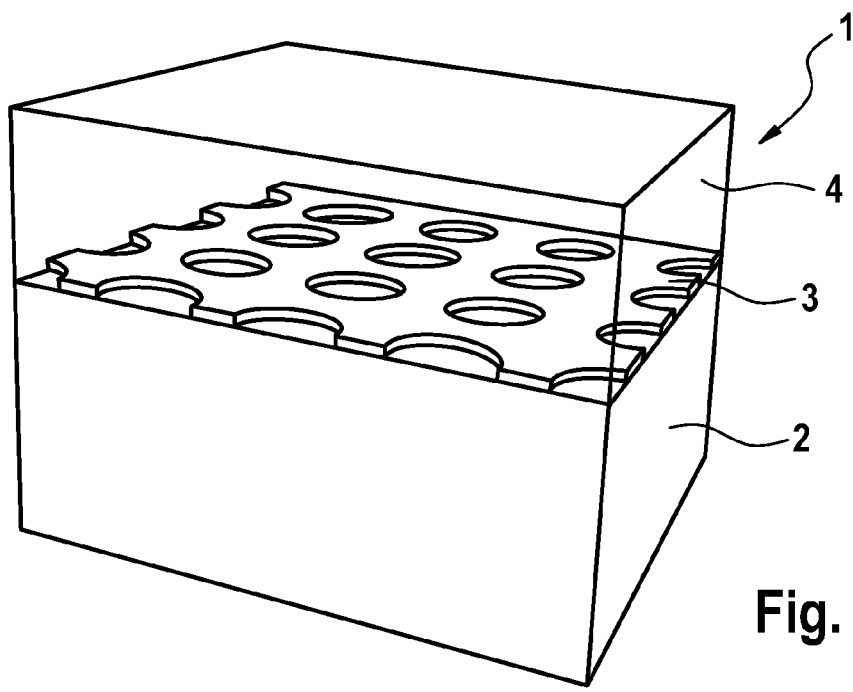
FIG. 1 is a perspective view of an enhanced surface-emitting optical switch.
Figure 2:
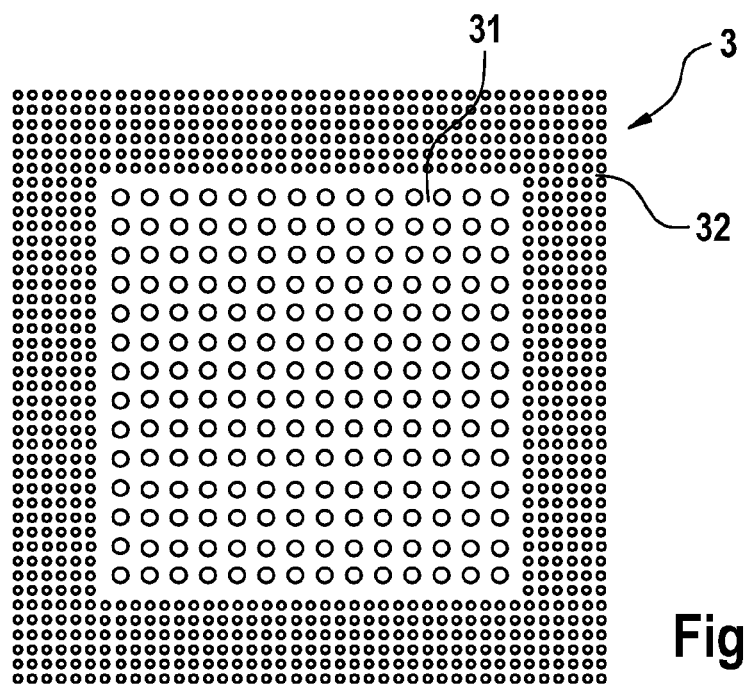
FIG. 2 is a plane view of a distributed feedback structure of the enhanced surface-emitting optical switch of FIG. 1.

With respect to FIGS. 1 and 2, an enhanced surface-emitting optical switch device 1 is shown. The optical switch device is formed on a substrate 2, such as a silicon substrate or another transparent or non-transparent material. Other substrate materials can also be applied. On the surface of the substrate a photonic crystal 3 made of a dielectric material is provided. The photonic crystal 3 is formed as a distributed feedback structure. The distributed feedback structure comprises a layer of dielectric material having circular openings in a square pattern. The pattern has a specific periodicity, i.e. a number of openings along one direction.

The structure of the dielectric material layer is shown in FIG. 2 in a plane view. As can be seen in FIG. 2, the distributed feedback structure of the photonic crystal 3 includes a two-dimensionally periodic second-order distributed feedback device 31 surrounded by a first-order distributed feedback device 32. As mentioned above, the second-order distributed feedback structure 31 is capable of emitting laser light in a direction substantially normal to a main plane of the distributed feedback structure 31.

The photonic crystal 3 can be made of, for instance, $Ta_2O_5$. Other dielectric materials are applicable as well. The lattice constant of the so-formed photonic crystal 3 is defined by the distance between the openings (holes) in the distributed feedback layer. The lattice constant usually determines one mode with a desired wavelength of the optical switch.

The photonic crystal 3 is covered with an optical gain layer 4 made of an optical gain material such as methyl-substituted ladder-type poly (para-phenylene) (MeLPPP). MeLPPP is an organic compound which shows a high gain of about 2,000 $cm^{-1}$ over a broad region with a maximum at about $\lambda=493$ nm at room temperature. Other optical gain materials could be used as well.

In some embodiments, a transparent layer between the substrate 2 and the photonic crystal 3 layer can be provided to avoid an interaction of the mode with the substrate 2 and the photonic crystal layer 3. For example, the transparent layer can be made of $SiO_2$, which should have a thickness that is large enough to reduce the absorption in the substrate 2. The reduction of the absorption in the substrate 2 results in an increase of the quality factor of the waveguide mode. The quality factor of a resonator, in general, is a measure of the strength of the damping of its oscillation. The quality factor is defined by the ratio of the resonance frequency and the full width at half maximum band width $\lambda_v$ of the resonance frequency.

The above-described optical switch device 1 can be excited by optical pump power above a lasing threshold. The lasing threshold is defined as the lowest excitation level at which a laser's output is dominated by stimulated emission of the optical gain material 4 rather than by spontaneous emission. Below the threshold, the laser's output power rises linearly (slowly) with increasing excitation, above the lasing threshold, the slope of power vs. excitation is much higher.

The lasing threshold of the above-described structures strongly depends on their geometric size. The lasing threshold is higher the smaller the area (i.e., the extension size) of the photonic crystal 3 is. This is the result of losses at the edge of the second-order distributed feedback region that increase for smaller areas. To reduce these losses, light propagating in the plane of the second-order distributed feedback structure 31 has to be reflected back into the second-order distributed feedback structure 31 at the edges thereof.

Since the integrability of common mirror structures with reasonable quality is limited, first-order distributed feedback structures 32 having no perpendicular light emission are used as mirrors. This is shown, for example, in FIG. 2, wherein the second-order distributed feedback structure 31 is surrounded by a first-order distributed feedback structure 32. Although in the present embodiment the first-order feedback 32 structure is surrounding the second-order feedback structure 31, it might also be possible, with a reduced performance, to just provide the first-order feedback structures 32 on two opposing sides of the second-order feedback structure 31.

The geometry of the first-order feedback structure 32 may be tuned such that the center of its bandgap is around the lasing wavelength of the second-order feedback structure 31 in order to get the highest possible reflectivity. The first-order feedback structure 32 has substantially the same shape as the second-order feedback structure, meaning a layer that is coplanar to the second-order feedback layer 31 and has openings (holes). The distance between the openings in the first-order feedback structure 32 may be about half of the distance of the openings in the second-order feedback structure 31.

Figure 3:
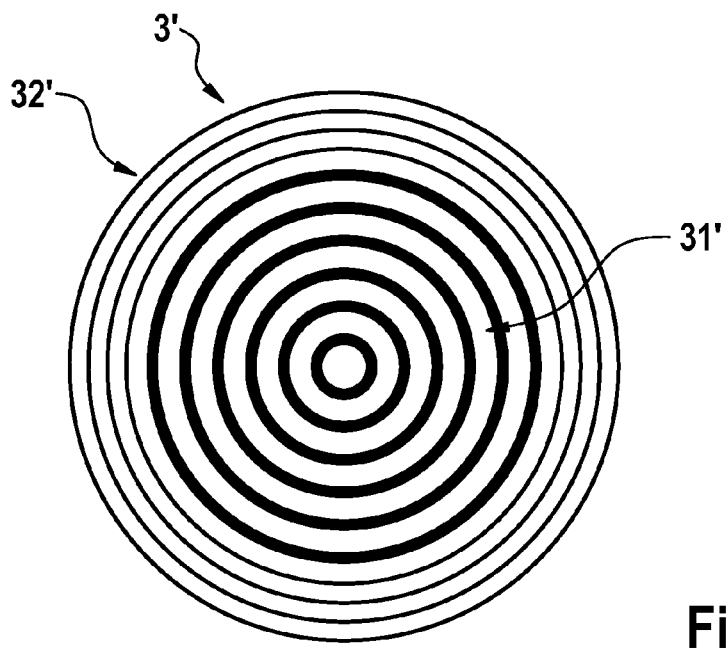
FIG. 3 is a plane view of a distributed feedback structure according to a further embodiment.

In FIG. 3 a further embodiment of the optical switch device is shown. The embodiment of FIG. 3 shows the photonic crystal layer 3' of a circular structured distributed feedback layer. The so formed circular grating structure includes concentric circular elevations wherein a second-order circular distributed feedback structure 31' the elevations have a first radial distance and a first-order circular distributed feedback structure 32' the elevations have a second radial distance between each other.

Figure 4:
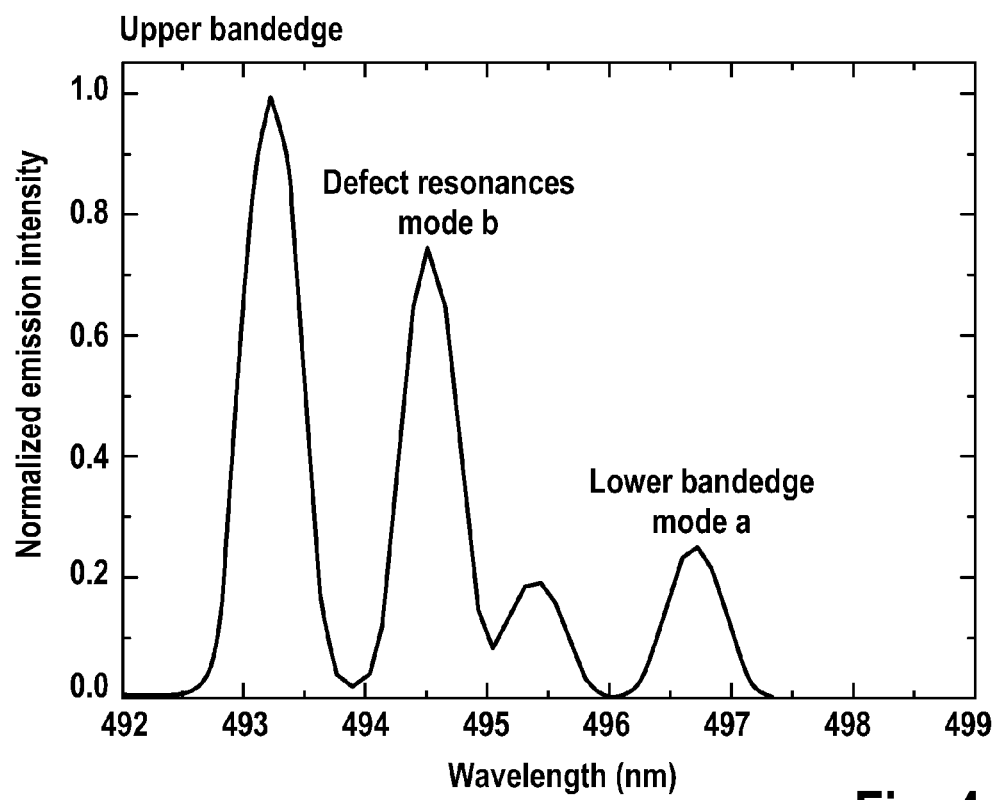
FIG. 4 is a diagram showing the lasing emission of the optical switch device of FIG. 1 showing different wavelength modes.

Usually, the second-order distributed feedback structure 31 provides different modes of wavelength of emitted light such as an upper bandedge mode and a lower bandedge mode. Depending on the number of periods of openings (periodicity) in the second-order distributed feedback structure 31, one or more bands with wavelengths between the upper and lower bandedge (band gap) mode wavelengths could be observed. Because these additional bands resemble defect states in a photonic crystal 3, they are referred to as defect modes herein. This is exemplarily shown in FIG. 4. FIG. 4 shows a diagram indicating the relation between a normalized emission intensity and the wavelength of emitted light for an example of an optical switch device. It can be seen that between an upper bandedge (lowest wavelength of emitted light) and a lower band edge mode (highest wavelength of emitted light) a first defect mode and a second defect mode are established having significant emission intensities.

The geometry of the second-order distributed feedback structure 31 is chosen so that the bandgap is centered around the light-emitting wavelengths (of the lower bandedge and the upper bandedge). In an example MeLPPP as the optical gain material is used. Furthermore, a structure width with a lattice constant a is selected to determine the light-emitting wavelength of the optical switch device 1. The further parameters of the second-order photonic crystal are then its height of 0.1 a, the radius of the openings in the photonic crystal 3 of 0.35 a, the overall height of the gain material layer 4, and the photonic crystal 3 of 0.7 a. The first-order distributed feedback structure 32 which forms a distributed Bragg reflector is then designed to suppress the propagation of the predefined light-emitting wavelengths which are then reflected back into the resonator formed by the second-order distributed feedback structure 31.

The defect modes occur when the second-order distributed feedback structure 31 has a limited size and the first-order distributed feedback structure (distributed Bragg reflector) 32 provides a substantial reflection of the light-emitting wavelengths back into the second-order distributed feedback structure 31. Substantially, the defect bands in the example of FIG. 4 can be observed for small numbers of second-order periods but disappear for more than 200 second-order periods.

In one embodiment, the second-order distributed feedback structure 31 and the first-order distributed feedback structure 32 are designed such that defect modes are established between the upper bandedge wavelength (about 493 nm in FIG. 4) and the lower bandedge wavelength (about 497 nm in FIG. 4), which have an equal or similar quality factor such that by varying the pump power of an excitation light beam it may be selected in which one of the bandedge modes and defect modes the optical switch device 1 is emitting light.

Figure 5:
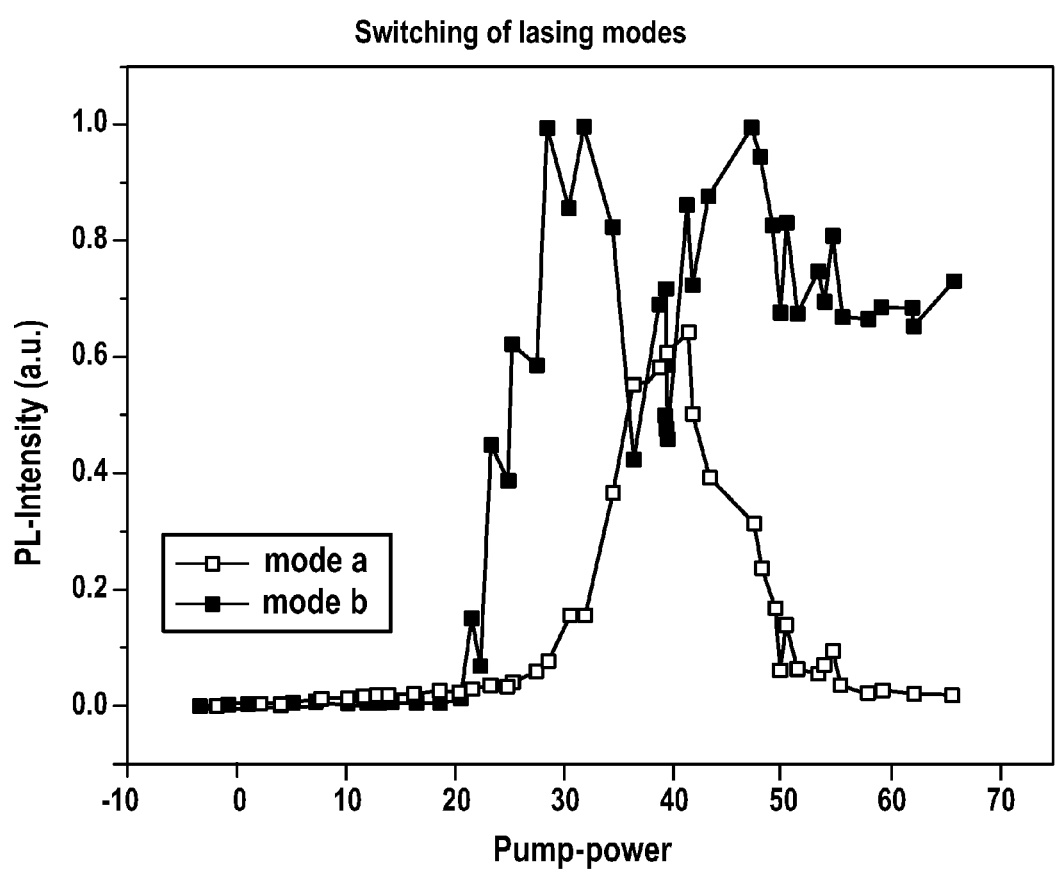
FIG. 5 is a diagram illustrating the intensity between two modes of the lasing emission depending on the intensity of the pump light.

As shown in FIG. 5, wherein the normalized intensity of the output laser light is depicted vs. the pump power of an optical excitation light beam, it can be seen that in a first power range of between about 20 to 35 $\mu J/cm^2$ the defect resonance mode (indicated with mode b) is obtained while in the pump power range of more than 35 $\mu J/cm^2$ the lower bandedge mode is selected (indicated with mode a). This means that the output wavelength of the optical switch device can be easily switched by selecting the pump power of the excitation light.

Instead of light the optical gain material can also be excited by electrical energy, e.g. by an electrical current flowing through the optical gain material. In some embodiments a combination of both excitation types can be used. For example, the optical gain material can be biased by irradiating light having a predetermined power (intensity). Between the modes of wavelengths can be switched by varying the electric current flowing through the optical gain material. Vice versa, the optical gain material can be biased by a predetermined electric current flowing through the optical gain material. Between the modes of wavelengths can be switched by irradiating light having a variable power (intensity) onto the optical gain material.

The above-described embodiment is related to square lattice first-order photonic crystals and square lattice second-order photonic crystals while other implementations having triangular lattice photonic crystals or hexagonal lattice photonic crystals are also possible to implement the present invention. It is beneficial that the second-order distributed feedback structure 31, i.e. the resonance structure, and the first-order distributed feedback structure 32, i.e. the reflector structure provide one or more defect modes having a quality factor equal or similar to the quality factor of one of the bandedge modes to obtain a reasonable output power of the emitted wavelength.

The above-described optical switch device 1 may be ideally suited for optical interconnect applications. The optical device allows for switching between different wavelengths and can also be switched on and off by adjusting the pump power of the excitation. Due to the option to freely select the lattice constant a of the second-order distributed feedback structure 31, the optical switch device 1 can be adjusted to any wavelength needed.

While one or more embodiments of the present invention have been illustrated in detail, the skilled artisan will appreciate that modifications and adaptations to those embodiments may be made without departing from the scope of the present invention as set forth in the following claims.

What is claimed is:

1. An optical switch device comprising:
a substrate;
a photonic crystal having a dielectric material, the photonic crystal applied on the substrate; and
an optical gain layer having an optical gain material, the optical gain layer disposed above the photonic crystal;
wherein the photonic crystal is formed with a second-order distributed feedback structure to emit laser light perpendicular to a plane of the photonic crystal and a first-order distributed feedback structure adapted for reflecting light in the plane of the photonic crystal back into the second-order distributed feedback structure, the first-order distributed feedback structure at least one of fully surrounding the second-order distributed feedback structure and being arranged on two opposing edges of the second-order distributed feedback structure; and further wherein the second-order distributed feedback structure has single structures with a periodicity indicating the number of repetitions of the single structures and a lattice constant indicating a distance between the single structures and defining an upper bandedge wavelength and a lower bandedge wavelength of light to be emitted, the second-order distributed feedback structure having a periodicity selected such that at least one defect modes of wavelengths between the upper bandedge wavelength and the lower bandedge wavelength are established having a quality factor of more than a predetermined threshold.

2. The optical switch device of claim 1, in combination with the second-order distributed feedback structure and the first-order distributed feedback structure.

3. The optical switch device of claim 1, wherein the dielectric material and the optical gain material have different refractive indices.

4. The optical switch device of claim 1, wherein the second-order distributed feedback structure has a periodicity which is selected depending on the contrast of refractive indices of the dielectric material of the second-order distributed feedback structure and the optical gain material.

5. The optical switch device of claim 1, wherein the periodicity of the second-order distributed feedback structure and the periodicity of first-order distributed feedback structure are adapted such that a ratio of the quality factor of the defect mode of a wavelength generated by the first-order distributed feedback structure and the quality factor of a bandedge mode of a wavelength generated by the second-order distributed feedback structure is greater than 0.01.

6. The optical switch device of claim 1, wherein the power of an excitation light irradiated onto the optical switch device is selectable to one of emit no light, emit light of a first wavelength, and emit light of a second wavelength.

7. The optical switch device of claim 6, wherein the emission of no light occurs when the power of the excitation light is below a lasing threshold.

8. The optical switch device of claim 7, wherein the light of the first wavelength is emitted when the power of the excitation light is above the lasing threshold and below a second threshold.

9. The optical switch device of claim 8, wherein the light of the second wavelength is emitted when the power of the excitation light is above the second threshold.

10. The optical switch device of claim 1, wherein the optical gain material is adapted to be excited by performing at least one of irradiating light and supplying an electric current.

11. A method of manufacturing an optical switch device comprising:
  providing a substrate;
  providing a photonic crystal having a dielectric material, the photonic crystal applied on the substrate; and
  providing an optical gain layer having an optical gain material, the optical gain layer disposed above the photonic crystal;

wherein the photonic crystal is formed with a second-order distributed feedback structure to emit laser light perpendicular to a plane of the photonic crystal and a first-order distributed feedback structure adapted for reflecting light in the plane of the photonic crystal back into the second-order distributed feedback structure, the first-order distributed feedback structure at least one of fully surrounding the second-order distributed feedback structure and being arranged on two opposing edges of the second-order distributed feedback structure; and further wherein the second-order distributed feedback structure has single structures with a periodicity indicating the number of repetitions of the single structures and a lattice constant indicating a distance between the single structures and defining an upper bandedge wavelength and a lower bandedge wavelength of light to be emitted, the second-order distributed feedback structure having a periodicity selected such that at least one defect modes of wavelengths between the upper bandedge wavelength and the lower bandedge wavelength are established having a quality factor of more than a predetermined threshold.

12. The method of manufacture of claim 11, further including providing the photonic crystal in combination with the second-order distributed feedback structure and the first-order distributed feedback structure.

13. The method of manufacture of claim 11, wherein the dielectric material and the optical gain material have different refractive indices.

14. The method of manufacture of claim 11, wherein the second-order distributed feedback structure has a periodicity which is selected depending on the contrast of refractive indices of the dielectric material of the second-order distributed feedback structure and the optical gain material.

15. The method of manufacture of claim 11, wherein the periodicity of the second-order distributed feedback structure and the periodicity of first-order distributed feedback structure are adapted such that a ratio of the quality factor of the defect mode of a wavelength generated by the first-order distributed feedback structure and the quality factor of a bandedge mode of a wavelength generated by the second-order distributed feedback structure is greater than 0.01.

16. The method of manufacture of claim 11, wherein the power of an excitation light irradiated onto the optical switch device is selectable to one of emit no light, emit light of a first wavelength, and emit light of a second wavelength.

17. The method of manufacture of claim 16, wherein the emission of no light occurs when the power of the excitation light is below a lasing threshold.

18. The method of manufacture of claim 17, wherein the light of the first wavelength is emitted when the power of the excitation light is above the lasing threshold and below a second threshold.

19. The method of manufacture of claim 18, wherein the light of the second wavelength is emitted when the power of the excitation light is above the second threshold.

20. The method of manufacture of claim 11, wherein the optical gain material is adapted to be excited by performing at least one of irradiating light and supplying an electric current.

* * * * *